(12) United States Patent
Wunderlich et al.

(10) Patent No.: US 7,939,870 B2
(45) Date of Patent: May 10, 2011

(54) MAGNETORESISTIVE DEVICE

(75) Inventors: Joerg Wunderlich, Cambridge (GB);
Byong Guk Park, Cambridge (GB);
Alexander Shick, Prague (CZ); Tomas Jungwirth, Prague (CZ); Frantisek Maca, Prague (CZ)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/324,168

(22) Filed: Nov. 26, 2008

(65) Prior Publication Data

US 2009/0146232 A1 Jun. 11, 2009

(30) Foreign Application Priority Data

Nov. 27, 2007 (EP) ..................................... 07121701

(51) Int. Cl.
*H01L 29/72* (2006.01)
(52) U.S. Cl. ............ 257/295; 257/9; 257/296; 365/173; 427/131
(58) Field of Classification Search .............. 257/9, 295, 257/296; 365/173; 427/131
See application file for complete search history.

(56) References Cited

U.S. PATENT DOCUMENTS

| 5,764,567 | A | 6/1998 | Parkin | |
|---|---|---|---|---|
| 2005/0226043 | A1* | 10/2005 | Parkin et al. | 365/173 |
| 2009/0324814 | A1* | 12/2009 | Parkin | 427/131 |

OTHER PUBLICATIONS

European Search Report, 07121701.2-1232, Apr. 17, 2008.

C. Gould et al., "Tunneling Anisotropic Magnetoresistance: A Spin-Valve-Like Tunnel Magnetoresistance Using a Single Magnetic Layer", Physical Review Letters, vol. 93, p. 117203 (Sep. 2004).
C. Rüster et al., "Very Large Tunneling Anisotropic Magnetoresistance of a (Ga,Mn)As/GaAs/(Ga,Mn)As Stack", Physical Review Letters, vol. 94, p. 027203 (Jan. 2005).
A. B. Shick et al., "Prospect for room temperature tunneling anisotropic magnetoresistance effect: Density of states anisotropies in CoPt systems", Physical Review B, vol. 73, p. 024418 (Jan. 2006).
P. Bruno et al., "Resonant tunneling spin valve: A novel magnetoelectronics device", J. Appl. Phys., vol. 84, No. 2, (Jul. 1998).
J. Moser et al., "Tunneling Anisotropic Magnetoresistance and Spin-Orbit Coupling in Fe/GaAs/Au Tunnel Junctions", Physical Review Letters, vol. 99, p. 056601 (Aug. 2007).
A. B. Shick et al., "Relativistic spin-polarized theory of magnetoelastic coupling and magnetic anisotropy strain dependence: Application to Co/Cu(001)", Physical Review B, vol. 56, p. R14259 (Dec. 1997).
W. E. Pickett et al., "Smooth Fourier interpolation of periodic functions", Physical Review B, vol. 38, p. 2721 (Aug. 1988).
Z. Celinski et al., "Growth and Magnetic Studies of Lattice Expanded Pd in Ultrathin Fe(001)/Pd(001)/Fe(001) Structures", Phys. Rev. Lett. 65, 1156 (Aug. 1990).
I. Turek et al., "Electronic structure and volume magnetostriction of rare-earth metals and compounds", Journal of Magnetism and Magnetic Materials 290-291 (2005) 357-363.
J. Crangle et al., "Dilute Ferromagnetic Alloys", J. Appl. Phys. 36, 921 (Mar. 1965).

* cited by examiner

*Primary Examiner* — Edward Wojciechowicz
(74) *Attorney, Agent, or Firm* — Antonelli, Terry, Stout & Kraus, LLP.

(57) ABSTRACT

A magnetoresistive device comprises a ferromagnetic region, a non-ferromagnetic region, an insulating region and a conductive region. The insulating region is arranged between the ferromagnetic region and the conductive region so as to provide a tunnel barrier. The non-ferromagnetic region separates the insulating region and the ferromagnetic region.

52 Claims, 12 Drawing Sheets

MAGNETORESISTIVE DEVICE

FIELD OF THE INVENTION

The present invention relates to a magnetoresistive device.

BACKGROUND

Anisotropic magnetoresistance (AMR) sensors have replaced classical magneto-inductive coils in hard-drive read heads launching the era of spintronics. Their utility has, however, remained limited partly because the response of these ferromagnetic resistors to changes in magnetization orientation originates from generically subtle spin-orbit (SO) interaction effects.

Currently, giant magnetoresistance (GMR) and tunneling magnetoresistance (TMR) elements are used having at least two magnetically decoupled ferromagnetic layers which provide a remarkably elegant way of tying the magnetoresistance response directly to the ferromagnetic exchange splitting of the carrier bands without involving SO-coupling. Large magnetoresistances in these types of devices are usually obtained at the expense of a significantly increased structure complexity, to provide independent and different magnetization switching characteristics and spin-coherence of transport between the ferromagnetic layers.

Studies of AMR effects in ferromagnetic semiconductor tunneling devices show that AMR response can, in principle, be huge and richer than TMR, with the magnitude and sign of the magnetoresistance dependent on the magnetic field orientation and electric fields. Reference is made to "Tunneling Anisotropic Magnetoresistance: A Spin-Valve-Like Tunnel Magnetoresistance Using a Single Magnetic Layer" by C. Gould et al., Physical Review Letters, volume 93, page 117203 (2004) and "Very Large Tunneling Anisotropic Magnetoresistance of a (Ga,Mn)As/GaAs/(Ga,Mn)As Stack" by C. Rüster, C. Gould, T. Jungwirth, J. Sinova, G. M. Schott, R. Giraud, K. Brunner, G. Schmidt, and L. W. Molenkamp, Physical Review Letters, volume 94, page 027203 (2005).

Experimental demonstration of tunneling anisotropic magnetoresistance (TAMR) in a tunnel junction with a ferromagnetic metal electrode has recently been reported for an epitaxial Fe/GaAs/Au stack and reference is made to "Tunneling Anisotropic Magnetoresistance and Spin-Orbit Coupling in Fe/GaAs/Au Tunnel Junctions" by J. Moser, A. Matos-Abiague, D. Schuh, W. Wegscheider, J. Fabian, and D. Weiss, Physical Review Letters, volume 99, page 056601 (2007). The observed TAMR in this structure is relatively small, bellow 0.5%, consistent with the weak SO-coupling in Fe.

The present invention seeks to provide an improved magnetoresistive device.

SUMMARY

According to a first aspect of some embodiments of the present invention there is provided a magnetoresistive device comprising an insulating region arranged between a ferromagnetic region and a conductive region so as to provide a tunnel barrier and further comprising a non-ferromagnetic region which separates the insulating region and the ferromagnetic region.

Using a non-ferromagnetic region to separate the insulating region and the ferromagnetic region can help to increase tunneling anisotropic magnetoresistance compared with a similar device without the non-ferromagnetic region.

The non-ferromagnetic region may be configured such that the ferromagnetic region induces a magnetic moment in the non-ferromagnetic region.

The non-ferromagnetic region may comprise a metallic non-ferromagnetic material. The non-ferromagnetic region may comprise a transition metal or an alloy including a transition metal, such as platinum, palladium and/or iridium.

The non-ferromagnetic region may be antiferromagnetic.

The non-ferromagnetic region may comprise a single layer and may have a thickness (separating the insulating layer and the ferromagnet) of one, two or three monolayers.

The non-ferromagnetic region may comprise an antiferromagnetic material.

The antiferromagnetic material may comprise a rare earth element or an alloy including a rare earth element. The antiferromagnetic material may includes antiferromagnetic dysprosium, antiferromagnetic erbium, or include gadolinium (Gd) and europium (Eu), preferably in the form GdEuS.

The antiferromagnetic material may comprise a transition metal or an alloy including a transition metal. The antiferromagnetic material may include platinum and/or manganese.

The antiferromagnetic material may comprise an antiferromagnetic oxide, such as α-iron(III) oxide ($Fe_2O_3$).

The non-ferromagnetic region may comprise at least two layers and may comprise first and second layers. The first layer may have a thickness of one, two or three monolayers. The second layer may have a thickness of one, two or three monolayers.

The first layer may comprise a first transition metal or an alloy including the first transition metal and the second layer may comprise second, different transition metal or an alloy including the second transition metal. The first layer may comprise chromium. The first layer may comprise a ferromagnetic material and may be configured such that the material behaves antiferromagnetically. The first layer may comprise manganese, iron and/or cobalt. The second layer may comprise tungsten, palladium, platinum and/or iridium.

The non-ferromagnetic region may be ferrimagnetic.

The ferromagnetic region may comprise a metallic ferromagnetic material, such as cobalt, nickel or iron or an alloy comprising cobalt, nickel and/or iron. The ferromagnetic region may comprise at least two ferromagnetic regions separated by a non-ferromagnetic region. The non-ferromagnetic region may comprise a metallic non-ferromagnetic material, such as platinum.

The insulating region may comprise an oxide, such as aluminium oxide or magnesium oxide. The insulating region may have a thickness separating the conductive region and the non-ferromagnetic region of at least about 2 nm. The thickness of the insulating region may be no more than about 10 nm.

The conductive region may comprise a non-ferromagnetic material. The conductive region may comprise a transition metal or an alloy including a transition metal, such as platinum.

The conductive region may comprise a ferromagnetic material.

The device may be arranged as a multilayer stack including the ferromagnetic region, the non-ferromagnetic region, the insulating region and the conductive region. The device may be arranged as a pillar upstanding from a substrate. The pillar may have a width no more than about 10 μm, no more than about 1 μm or no more than about 100 nm. The pillar may have a diameter of the order of 10 or 100 nm.

The conductive region may include a resonant tunneling structure for filtering charge carriers.

According to a second aspect of some embodiments of the present invention there is provided a magnetic field sensor comprising the magnetoresistance device.

According to a third aspect of some embodiments of the present invention there is provided a read head for a hard disk drive comprising the magnetoresistance device.

According to a fourth aspect of some embodiments of the present invention there is provided a switching element comprising the magnetoresistance device.

According to a fifth aspect of some embodiments of the present invention there is provided a method of operating the magnetoresistive device, the method comprising applying a magnetic field to the magnetoresistive device and applying a bias between the ferromagnetic region and the conductive region so as to determine a magnetoresistance.

According to a sixth aspect of some embodiments of the present invention there is provided a method of fabricating a magnetoresistive device, the method including forming a ferromagnetic region, forming a non-ferromagnetic region adjacent to the ferromagnetic region, forming an insulating layer adjacent to the non-ferromagnetic region and forming a conductive region adjacent to the insulating region.

The method may further comprise etching the layers so as to form a pillar.

The method may comprise applying a stress, for example by applying a magnetic field, while depositing layers, e.g. the layers forming the ferromagnetic region, the non-ferromagnetic region, the insulating layer and the conductive region.

BRIEF DESCRIPTION OF THE DRAWINGS

Certain embodiments of the present invention will now be described, by way of example, with reference to the accompanying drawings in which:

FIG. 7a shows field-sweep magnetoresistance measurements in device A shown in FIG. 6a for θ=0 and 90° at three different bias voltages;

FIG. 7b are plots of corresponding TAMR curves at three different bias voltages for device A shown in FIG. 6a;

FIG. 7c illustrates temperature dependence of the TAMR for device A shown in FIG. 6a for a −5 mV bias and 10 T field;

DETAILED DESCRIPTION OF CERTAIN EMBODIMENTS

Figure 1:
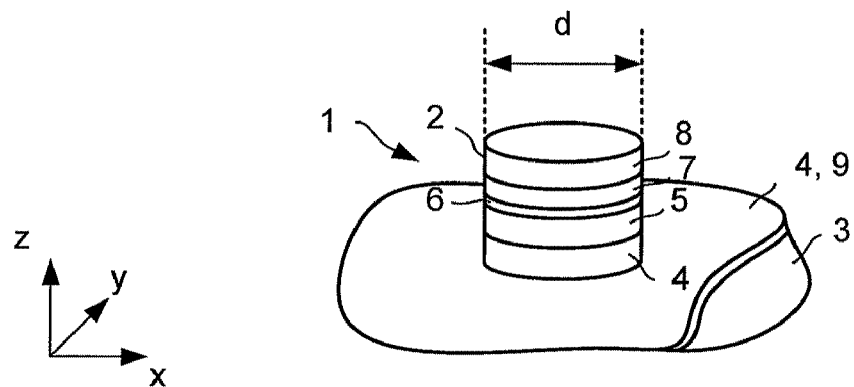
FIG. 1 is a perspective view of a magnetoresistive device in accordance with some embodiments of the present invention.
Figure 2:
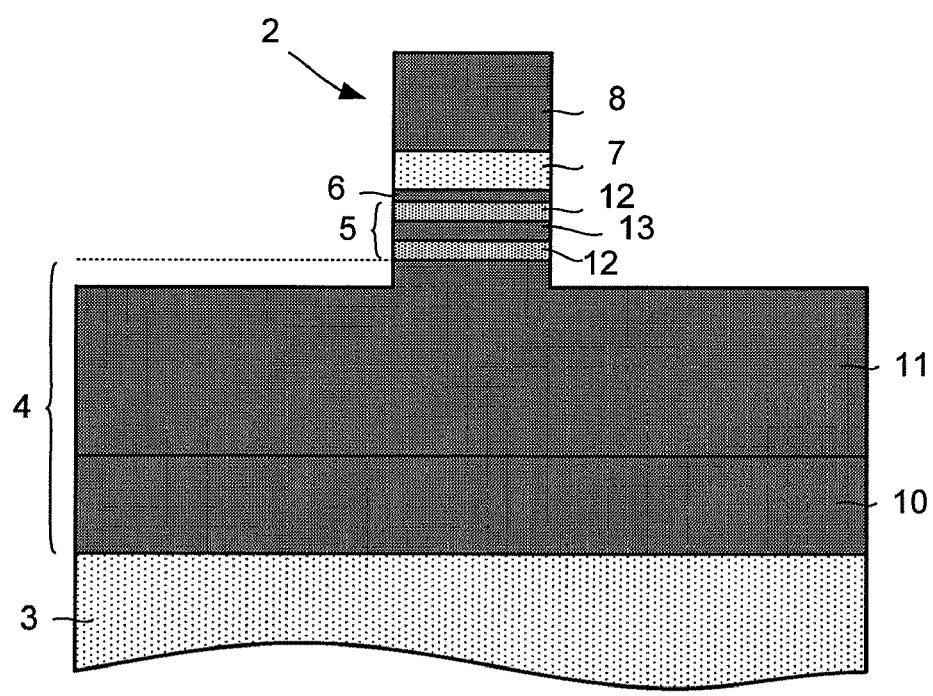
FIG. 2 is a cross-section view of the magnetoresistive device shown in FIG. 1.

Referring to FIGS. 1 and 2, a magnetoresistive device 1 in accordance with some embodiments of the present invention is shown.

Referring in particular to FIG. 1, the device 1 takes the form of vertical tunnel device comprising a pillar 2 formed on a substrate 3. The device 1 includes a first contact region 4 (in this example, a bottom contact), a ferromagnet 5, a non-ferromagnetic region 6 separating the ferromagnet 5 from an insulating region 7 providing a tunnel barrier and a second contact region 8 (in this example, a top contact region). Carrier transport between the ferromagnet 5 and the second contact 8 takes place sequentially through the non-ferromagnetic region 6 and the insulating region 7 and vice versa.

As shown in FIG. 1, the device 1 is formed from a multilayer stack and is arranged such that the ferromagnet 5 lies on top of the first contact region 4, the non-ferromagnetic region 6 lies on top of the ferromagnet 5, the insulating region 7 lies on top of the non-ferromagnetic region 6 and the second contact region 8 lies on top of the insulating region 7. However, the layer structure can be inverted. An inverted structure allows a double (or multiple) barrier heterostructure to be grown on a semiconductor substrate, a non-ferromagnetic region to be formed on the heterostructure and a ferromagnet to be formed on the non-ferromagnetic region. Thus, the heterostructure can provide a resonant tunneling structure which can be used as an energy filter, for example as described in P. Bruno et al., Journal of Applied Physics, volume 84, p 978 (1998).

The pillar 2 has a diameter, d, of about 10 µm. The pillar 2 may have a diameter less than 10 µm, for example about 1 µm or less than 1 µm. The pillar 2 may have a diameter corresponding to a track width of a hard disk, which is of the order of 10 or 100 nm, typically about 100 nm.

The lateral extent of a lower portion 9 of the bottom contact region 4 is larger than the width of the pillar 2 and forms a pad to which an electrical connection (not shown) can be made. For clarity, part of the lower portion 9 of the bottom contact region 4 is shown removed so as to reveal the underlying substrate 3.

The bottom contact region 4 may be patterned to form a track and/or pad (not shown) and to expose the portions of the substrate 3 so as to electrically isolate the device 1 from other devices (not shown) on the same substrate 3. In some embodiments, a conductive substrate may be used and an electrical connection (not shown) may be made to a back surface of the substrate.

In this example, the substrate 3 comprises silicon dioxide ($SiO_2$). However, other electrically-insulating materials may be used. For example, aluminium oxide ($Al_2O_3$) can be used. Aluminium oxide can be crystalline having a (0001) crystallographic orientation and this can be used to grow aligned or partially-aligned crystalline layers on top of it, such as (111)-orientated platinum.

Referring in particular to FIG. 2, the bottom contact region 4 comprises a layer 10 of tantalum (Ta) having a thickness of 5 nm and an overlying layer 11 of platinum (Pt) having a thickness of 10 nm. Other materials may be used instead of tantalum to provide a smooth surface. The tantalum layer may be omitted. Gold (Au) or palladium (Pd) may be used instead of platinum. Furthermore, the bottom contact 10, 11 layers can be thicker or thinner.

The ferromagnet 5 comprises alternating thin-film layers 12, 13 of cobalt (Co) and platinum (Pt). A layer of cobalt 12 is at the top of the stack 12, 13 and a layer of cobalt 12 is at the bottom of the stack 12, 13. The cobalt layers 12 have a thickness of about 1 nm and the platinum layer(s) 13 has a thickness of about 1 nm. The layers 12, 13 may be thicker for example, between about 1 and about 5 nm, and need not all have the same thickness. Other ferromagnetic materials may be used instead of cobalt, such as nickel (Ni) or iron (Fe) and alloys of cobalt and/or nickel and/or iron, and other intermediate layers can be used instead of platinum, such as gold (Au) or palladium (Pd) or non-magnetic alloys. Furthermore, a multilayer ferromagnet need not be used. For example, a ferromagnet formed from only one ferromagnetic metal or alloy, such as cobalt or nickel iron, and having a thickness, for example of about 2 nm, may be used.

In this example, the non-ferromagnetic region 6 comprises platinum (Pt) and has a thickness of two monolayers, which is about 0.5 nm. In the case of a material which is non-ferromagnetic and which is neither antiferromagnetic, nor ferrimagnetic (such a material is hereinafter referred to as a "non-magnetic" material), there are no inherent magnetic moments which can couple with the adjacent ferromagnet 5. Instead, the ferromagnet 5 can induce magnet moments in a thin layer of the non-magnetic material. In this case, it is preferred to use a layer of non-magnetic material which is as thin as possible so as to help induce magnetic moments in a portion of the region lying closest to the interface with the tunnel barrier. Thus, the non-ferromagnetic layer 6 may have a thickness of one, two or three monolayers. However, in some embodiments, the non-ferromagnetic region 6 may be thicker, having a thickness of four or five monolayers or between six and ten monolayers.

Other materials may be used such that a thin layer of the material is polarisable (i.e. a magnetic moment can be induced in the material) by a ferromagnet and, when polarized, the material exhibits an anisotropy in the density of states depending on whether magnetisation is aligned with a crystalline orientation and/or the current orientation, the anisotropy being large enough that any shift in a peak in the density of states (resulting from the change in orientation of the magnetisation) is of the order of $k_b T$ or more, where T is the working temperature, for example room temperature, in Kelvin. The anisotropy in the local density of states at the interface in the non-ferromagnetic material layer resulting from spin-orbit coupling of the polarised carriers (in this case, electrons) is much larger than the anisotropy in the local density of states if only the ferromagnet is used. Other materials can be used instead of platinum, for example other transition metals, such as palladium (Pd), iridium (Ir) or tungsten (W).

The magnetic anisotropy energy of the non-ferromagnetic region and ferromagnet is dominated by the ferromagnet. However, the magnetic anisotropy energy is small, e.g. a few mT, so that a weak external magnetic field can align magnetic moments in the layer with the hard axis. A lower value of magnetic anisotropy energy results in greater sensitivity. Greater sensitivity to magnetic fields is useful for hard drive read heads.

As will be explained later, the non-ferromagnetic region 6 need not be non-magnetic, but may be antiferromagnetic which can yield high values of TAMR. The antiferromagnetic, non-ferromagnetic region 6 may be formed as a single layer, for example, comprising an alloy of manganese (Mn) and iridium (Ir) or manganese and platinum (Pt). Alternatively, the antiferromagnetic, non-ferromagnetic region 6 may be formed as a multilayer, such as manganese (Mn) on platinum (Pt). The antiferromagnetic, non-ferromagnetic region 6 may include rare earth elements, such as dysprosium (in antiferromagnetic form) or an alloy of gadolinium (Gd), europium (Eu) and sulphur (S).

In some embodiments, the non-ferromagnetic region 6 may be ferrimagnetic, and may comprise gallium-doped yttrium-iron-garnet (YIG).

In the case where the non-ferromagnetic region 6 is antiferromagnetic or ferrimagnetic, the local moments in the non-ferromagnetic region 6 are exchange-coupled to the adjacent ferromagnet 5.

The insulating region 7 comprises aluminium oxide ($AlO_x$) and has a thickness of about 2 nm. Other insulating materials which can be oxides, nitrides or oxynitrides may be used, such as magnesium oxide (MgO), silicon dioxide ($SiO_2$) or silicon nitride ($Si_x N_y$). The insulating layer 7 may be thicker or thinner depending on the material used and the required tunnel current.

The top contact 8 comprises a layer of platinum having a thickness of about 5 nm. Other conductive materials may be used. For example, a non-ferromagnetic material may be used, such as gold (Au) or platinum (Pt). Alternatively, a ferromagnetic material may be used. A ferromagnetic material may be used where the contact also serves as a magnetic shield, for example as used in a hard disc drive read head. Furthermore, the top contact layer can be thicker or thinner. The contact 8 serves as an electrode to the tunnel barrier.

The non-ferromagnetic region 6, which is adjacent the ferromagnet 5 and the insulating layer 7, serves as another electrode to the tunnel barrier.

As will be explained in more detail layer, using a multilayer structure including a ferromagnet and an adjacent thin layer of transition metal can be used to generate large and tunable magnetic anisotropies at the interfaces by combined effects of induced moments and strong spin-orbit coupling. Placing these interfaces adjacent to the tunnel barrier can provide structures exhibiting high TAMR.

As will also be explained in more detail later, using a multilayer structure including a ferromagnet and a thin, exchanged-coupled antiferromagnetic or ferrimagnetic region can also lead to high values of TAMR.

Figure 3:
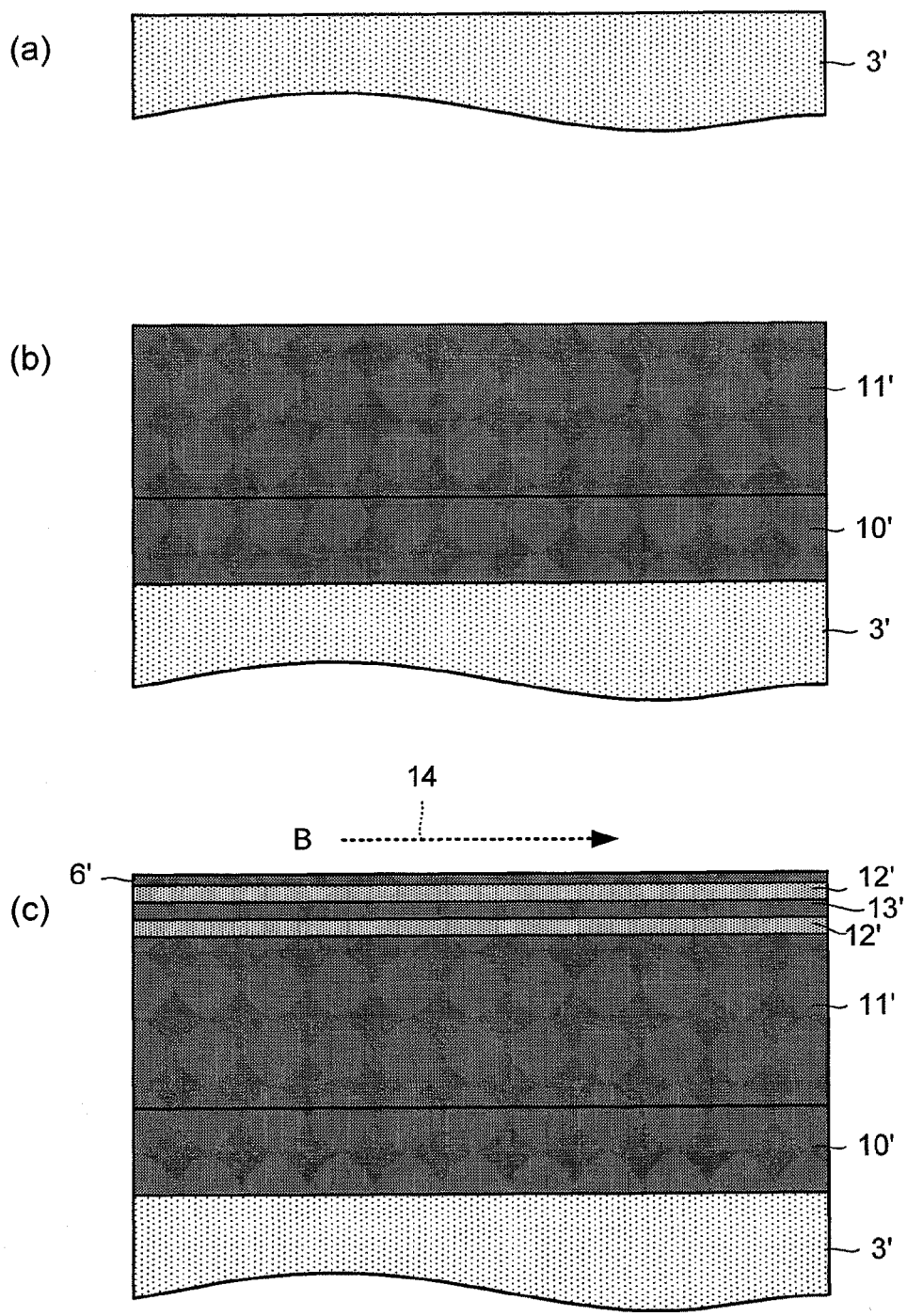
FIG. 3 illustrates steps during fabrication of the magnetoresistive device shown in FIG. 1.
Figure 3:
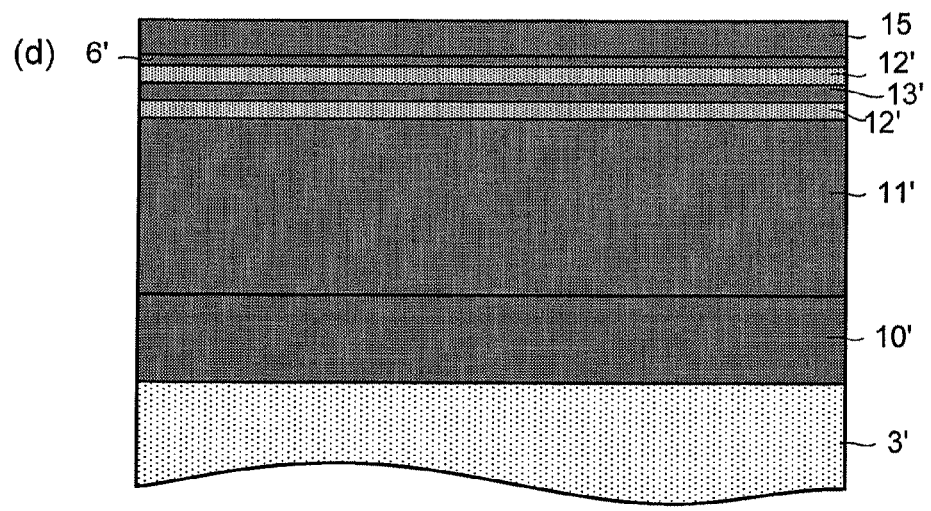
Figure 3:
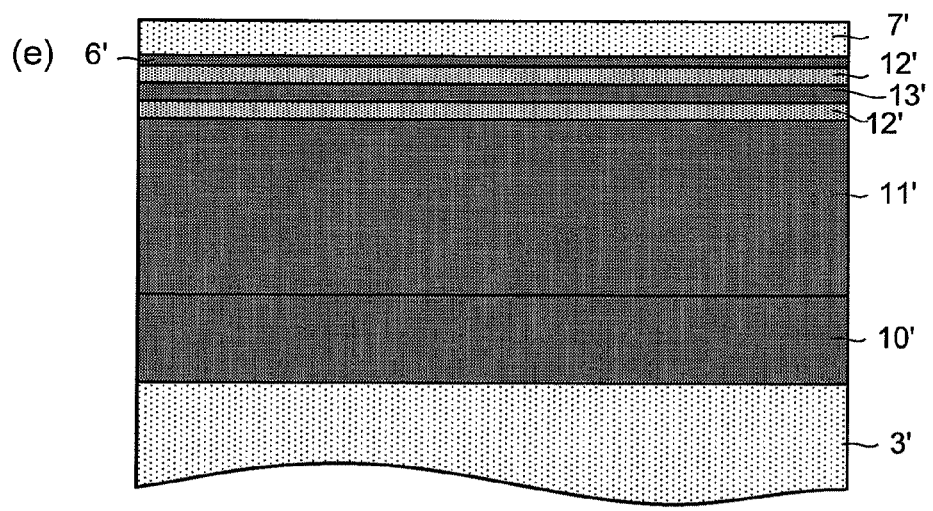
Figure 3:
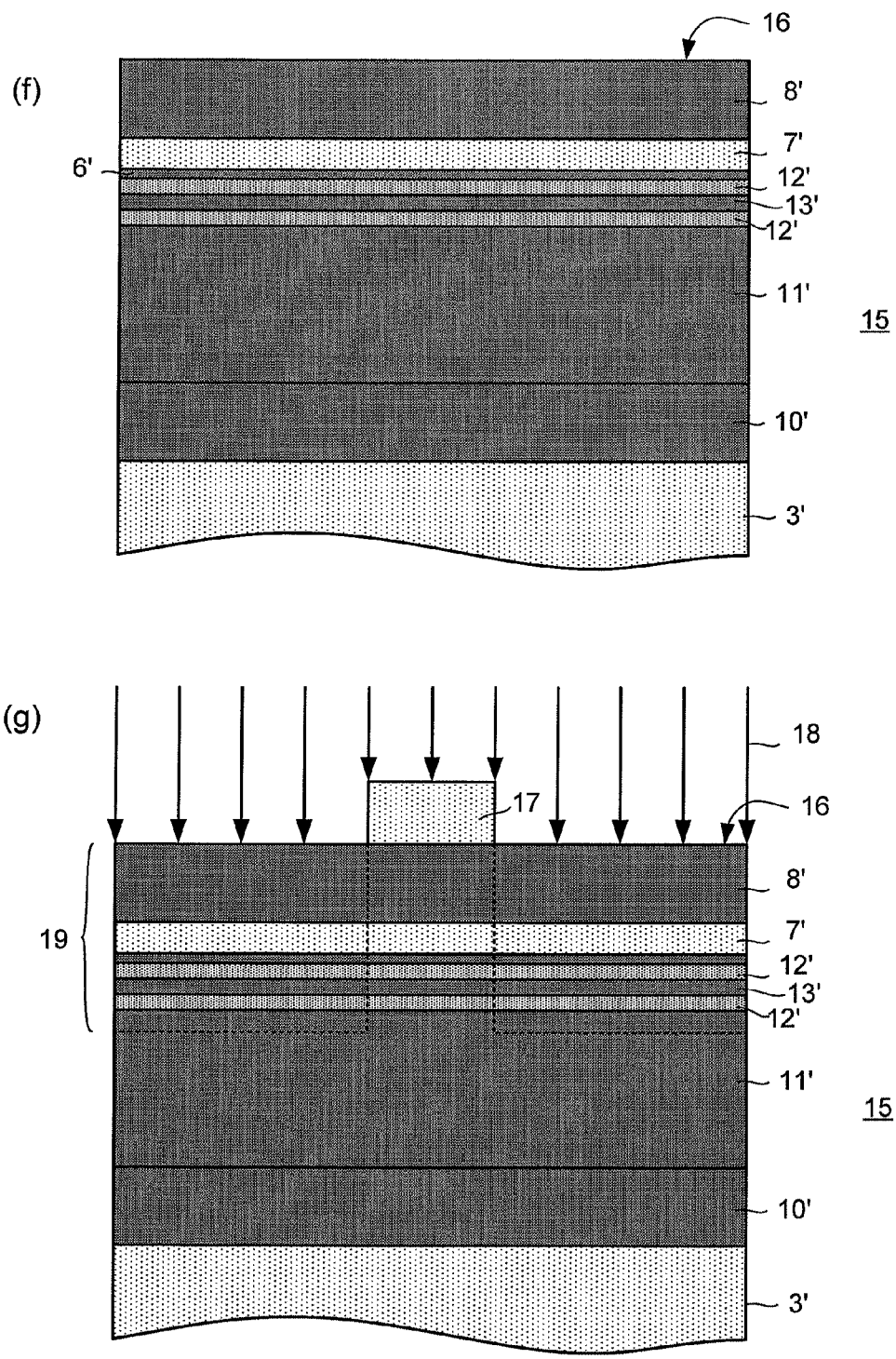

Referring to FIG. 3, a method of fabricating the magnetoresistive device 1 shown in FIG. 1 will now be described.

Referring to FIGS. 3a to 3c, successive layers 10', 11', 12', 13', 6' of tantalum, platinum, cobalt, platinum, cobalt and platinum are grown by magnetron sputtering on a thermally oxidized Si wafer 3'.

Magnetron sputtering is carried out in a chamber (not shown) having a base pressure of about $1-5 \times 10^{-7}$ Torr in an argon atmosphere at about $2-5 \times 10^{-3}$ Torr, at room temperature. The thin films 10', 11', 12', 13', 6' are grown at rates of about 1-5 Ås$^{-1}$.

A layer 10' of Ta having a thickness of about 50 Å, then a layer 11' of Pt having a thickness of 100 Å are grown to provide a seed layer for initiating growth of a textured Pt(111)/Co ferromagnetic film 12', 13' with a strong out-of-plane magnetocrystalline anisotropy.

Optionally, additional in-plane magnetic anisotropy can be introduced by applying a constant in-plane magnetic field 14 of the order of 0.1 T during film growth, e.g. while all the films are grown, along one of the cleave orientations of the wafer 3'. Applying the magnetic field can help to introduce stress into the films and, thus, vary the lattice constant along the stress field. Other means for introducing stress during growth can be used, such as a piezoelectric stressor.

Referring to FIG. 3d, a tunnel barrier is fabricated by sputtering a layer 15 of aluminum having a thickness of about 1.5 nm. The aluminum layer 15 is oxidized by plasma oxidation using a mixture of oxygen and argon as a feed gas.

Referring to FIG. 3e, plasma oxidation leaves a layer 7' of aluminum oxide.

Referring to FIG. 3f, growth of layers is completed by sputtering a layer 8' of platinum to form a sample 15.

The sample 15 is removed from the growth chamber (not shown) and is processed.

A layer of photoresist (not shown) is applied to the (upper) surface 16 of the sample 15 and patterned using conventional photolithographic techniques. Other lithographic techniques may be used, such as electron beam lithography.

Referring to FIG. 3g, a resist mask 17 is left on the surface 16 of the sample 15 and ion etching 18 is used to remove portions 19 of the sample 15. Etching is stopped once it penetrates the ferromagnetic film 12', 13'. This can be achieved by characterizing the etch so as to determine an etch rate and/or by sampling etch products during the etch.

As shown in FIGS. 1 and 2, ion etching defines the pillar 2 and the lateral extent of the ferromagnet 5, the thin non-ferromagnetic layer 6, the insulating layer 7 and the top contact region 8.

Further photolithographic and etching steps can be used to remove additional regions of the bottom contact region 4, e.g. to form tracks and/or to electrically isolate the device 3 from other devices.

Measurement of devices and (non-limiting) explanations of the behaviour of the devices will now be described.

Measurement and behaviour of the device 1 and devices (not shown) of a similar type, i.e. devices having an alternating sequence of Pt and Co layers 12, 13 beneath the AlO$_x$ barrier 7 terminated by a 0.5 nm (i.e. two-monolayer) Pt film 6, are compared with devices 20 (FIG. 4) of a different type, i.e. devices similar to sample A but in which the Pt film is omitted. The two types of devices 1, 20 are referred to herein as "type A samples" (or "sample A" or "device A") and "type B samples" (or "Sample B" or "device A") respectively.

The devices have pillar diameters of 10-100 μm and have corresponding resistances of the order ~10-100 kΩ.

Figure 4:
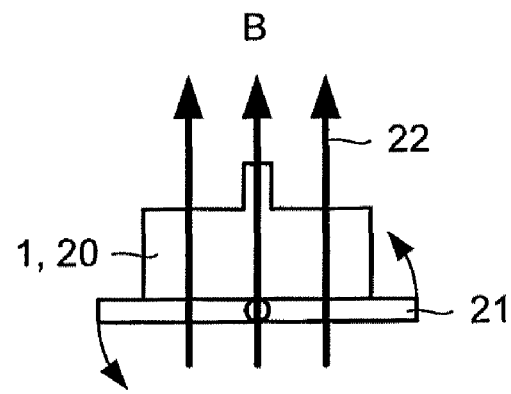
FIG. 4 illustrates mounting a device for experimental measurement.

Referring to FIG. 4, devices 1, 20 are mounted on a rotating sample holder 21 allowing the application of magnetic fields 22 up to 10 T at various in-plane and out-of-plane angles.

Figure 5:
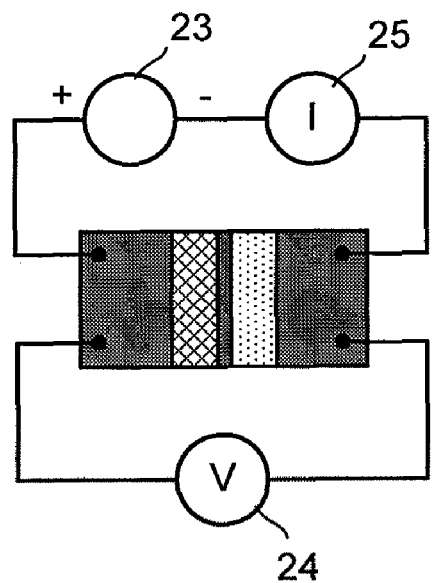
FIG. 5 illustrates a four-terminal measurement of a device.

Referring to FIG. 5, four-point transport measurements, using a voltage source 23, voltmeter 24 and ammeter 25, are used to determine values of tunneling anisotropic magnetoresistance (TAMR) of each device 1, 20.

FIGS. 6a and 6b show schematic layer structures for the device 1 (i.e. "device A") and device 20 (i.e. "device B"). FIGS. 6c and 6d are TAMR traces defined as $(R(\theta)-R(0°))/R(0°)$ at −5 mV bias and 4 K for device A and device B respectively.

FIGS. 6e and 6f are SQUID magnetization measurements for out-of-plane magnetic fields. FIG. 6g illustrates orientation of magnetic field to the sample 1, 20.

FIGS. 6c and 6d illustrate differences in characteristic magnetization and magnetotransport anisotropy data measured in samples A and B (FIGS. 6a & 6b). Wide and square hysteresis loops in perpendicular magnetic fields, shown in the FIGS. 6e and 6f, confirm the presence of strong magnetic anisotropy with out-of-plane easy axis in both devices. The anisotropic magnetotransport in the two types of devices (FIGS. 6a & 6b) is, however, different.

The TAMR traces plotted in FIGS. 6c are defined as $(R(\theta)-R(0°))/R(0°)$ and are taken at 10 T magnetic field rotating from the perpendicular ($\theta=0°$) to the in-plane ($\theta=90°$) direction. In both samples, the TAMR exhibit uniaxial symmetry, but the magnitude of the effect is enhanced by 2 orders of magnitude in sample A (FIG. 6a).

In sample A (FIG. 6a), the large TAMR signal is attributed to an induced moment and strong SO-coupling in the two-monolayer Pt film inserted between Co and the tunnel barrier. In sample B (FIG. 6b), the nearest Pt/Co interfaces to the barrier is covered by 1 nm (five-monolayer) Co film and, therefore, this tunneling device behaves effectively as a Co/barrier/normal-metal stack for which the magnetotransport anisotropy is comparably weak.

Figure 6:
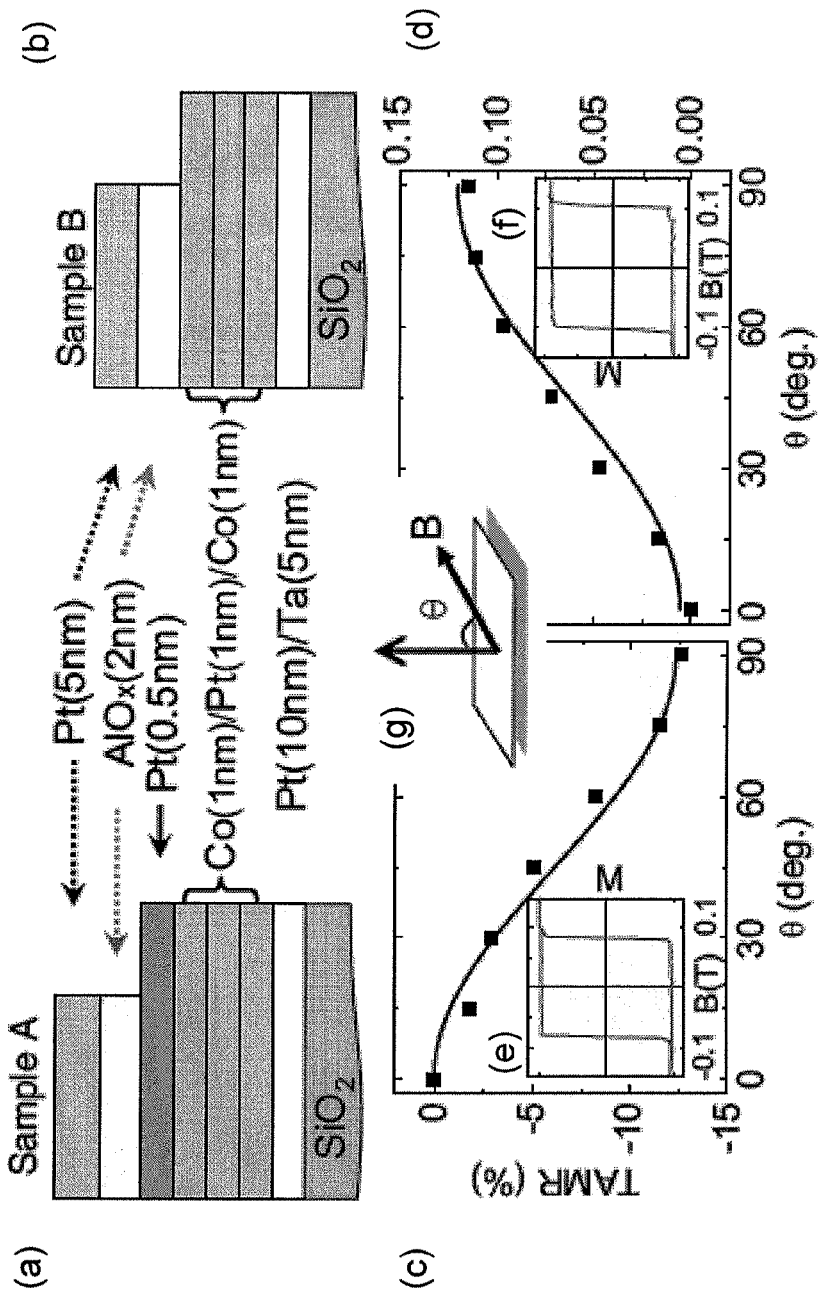
FIGS. 6a and 6b show schematic layer structures for a device ("device A") in accordance with the present invention and a comparative example ("device B")
FIGS. 6c and 6d are TAMR traces for devices A and B shown in FIGS. 6a and 6b.
FIGS. 6e and 6f are SQUID magnetization measurements for out-of-plane magnetic fields for devices A and B shown in FIGS. 6a and 6b.
FIG. 6g illustrates orientation of a magnetic field to a device.
Figure 7:
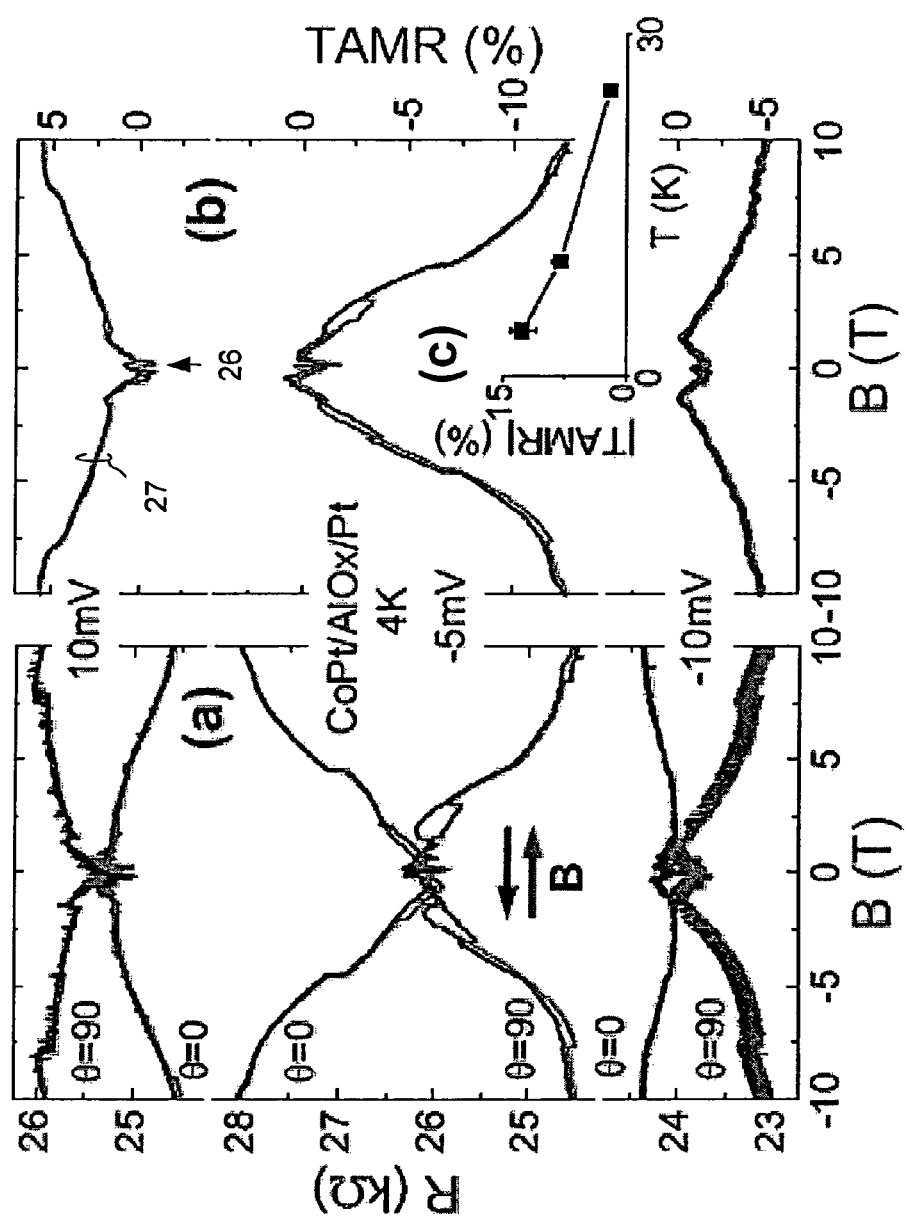
Figure 8:
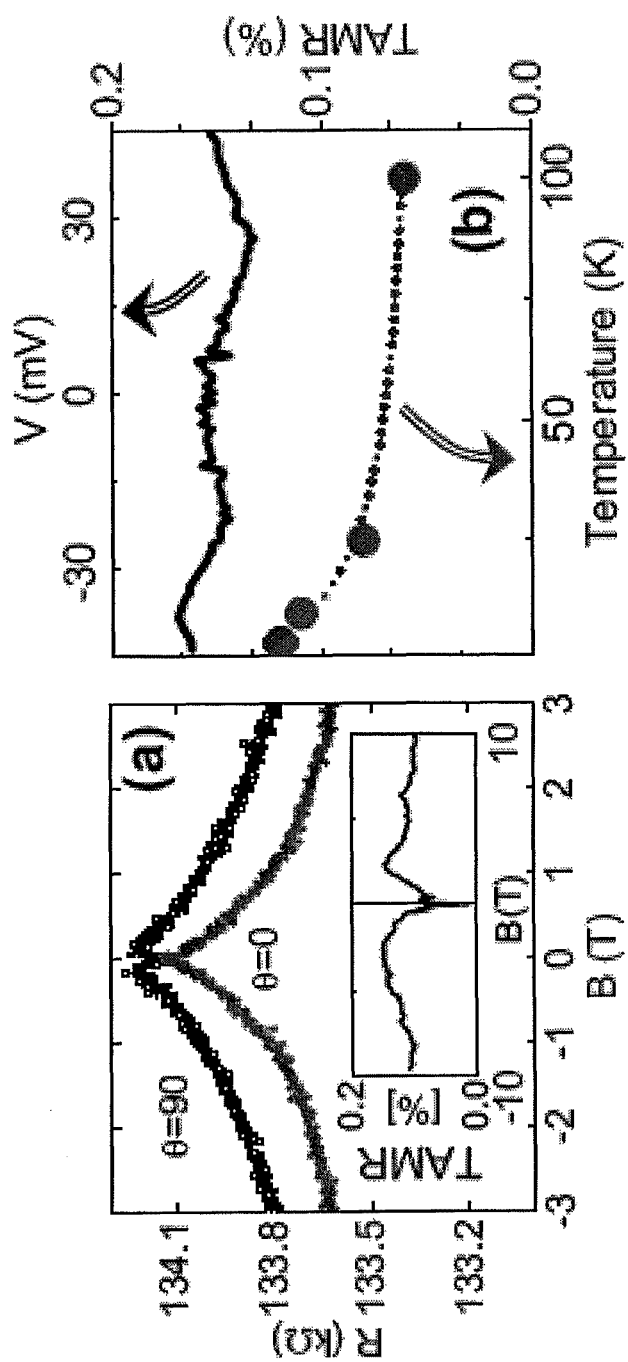
FIG. 8a illustrates resistance and TAMR (inset) defined as (R(90°)−R(0°)/R(0°) of device B at 10 mV bias and 4 K.
FIG. 8b illustrates temperature and bias dependence of the TAMR of device B at 10 T field.

The distinct phenomenologies of samples A and B (FIGS. 6a & 6b) are also illustrated in FIGS. 7 and 8.

FIG. 7a shows field-sweep magnetoresistance measurements in sample A (FIG. 6a) for $\theta=0°$ and 90° at three different bias voltages. FIG. 7b are plots of corresponding TAMR curves at three different bias voltages. FIG. 7c illustrates temperature dependence of the TAMR for a −5 mV bias and 10 T field.

Initial onset 26 of the TAMR, seen clearly in the 10 mV bias measurement 27, and associated with rotation of the magnetization from the out-of-plane easy-axis direction in the in-plane field sweep, is followed by a further dependence of the TAMR on the field strength at higher fields with no signs of saturation up to the maximum measured field of 10 T. Since appreciable magnetoresistance is observed in both in-plane and out-of-plane field sweeps and the sign of the magnetoresistance changes from positive to negative for different bias voltages, the Lorentz force can be excluded as the origin of the TAMR in the thin tunnel barrier devices. Apart from the strong field and bias dependence, large variation of the TAMR magnitude with temperature is observed, as shown in FIG. 8c. These observations are unique to the samples of type A (FIG.

6a). Samples of type B (FIG. 6b) show only weak dependence of their TAMR on field strength, bias and temperature, as shown in FIG. 8.

The behavior of the two types of Co/Pt tunneling devices can be modeled by calculating density of states (DOS) anisotropies in the ferromagnetic electrode with respect to the orientation of the magnetic moment. The model assumes proportionality between the DOS and the differential tunneling conductance anisotropies.

The spin-orbit-coupled ("SO-coupled") band structures are obtained within the local spin density approximation using the relativistic version of the full-potential linearized augmented plane-wave method (FP-LAPW) in which SO interaction is included in a self-consistent second-variational procedure. Reference is made to "Prospect for room temperature tunneling anisotropic magnetoresistance effect: Density of states anisotropies in CoPt systems" by A. B. Shick, F. Máca, J. Mašek, and T. Jungwirth, Physical Review B, volume 73, page 024418 (2006) and "Relativistic spin-polarized theory of magnetoelastic coupling and magnetic anisotropy strain dependence: Application to Co/Cu(001)" by A. B. Shick, D. L. Novikov, and A. J. Freeman, Physical Review B, volume 56, page R14259 (1997).

A magnetic force theorem is used to evaluate the DOS anisotropy and reference is made to "Local spin density functional approach to the theory of exchange interactions in ferromagnetic metals and alloys" by A. I. Liechtenstein, M. I. Katsnelson, V. P. Antropov, and V. A. Gubanov, Journal of Magnetism and Magnetic Materials, volume 67, page 65 (1987). Starting from self-consistent charge and spin densities calculated for the magnetic moment aligned along one of principal axes, the moment is rotated and a single energy-band calculation is performed for the new orientation of magnetization. The DOS anisotropies result from spin-orbit-coupling ("SO-coupling") induced changes in the band eigenvalues. In order to increase the accuracy in DOS evaluation, a smooth Fourier interpolation scheme described in "Smooth Fourier interpolation of periodic functions" by W. E. Pickett, H. Krakauer, and P. B. Allen, Physical Review B, volume 38, page 2721 (1988) is used together with a linear tetrahedron method.

To model sample A (FIG. 6a), thin-slab calculations are performed for five-monolayer Co sandwiched between two-monolayer Pt films. Sample B (FIG. 6b) is modeled by considering the thin Co film only.

Referring to FIG. 9a, the calculated DOS as a function of energy measured from the Fermi level are shown for the in-plane and out-of-plane magnetization orientations. For the Co/Pt model system, a complex structure of the DOS is found near the Fermi energy with the main features shifted by 10's of meV when comparing the two magnetization orientation curves. The Co-film, on the other hand, has a nearly featureless DOS near the Fermi level which depends very weakly on the magnetization direction. The relative difference between DOSs for the in-plane and out-of-plane magnetizations, which we relate to the tunneling conductance anisotropy, shows an oscillatory behavior as a function of energy for the Co/Pt slab with a magnitude of up to ~20%. For the Co film the magnitude and the energy dependence of the anisotropy is substantially weaker. These theoretical results are qualitatively consistent with measurements in samples A and B (FIGS. 6a & 6b) hereinbefore described.

Referring to FIGS. 9c and 9d, to facilitate a more direct comparison between theory and experiment, the measured differential conductances and the corresponding conductance anisotropies as a function of the bias voltage in sample A are shown. Both the relative shift of the differential conductances for the two magnetization orientations and the oscillatory behavior of the conductance anisotropy with changing bias seem to reflect qualitatively the anisotropic DOS behavior of the Co/Pt system seen in the theory curves.

Figure 9:
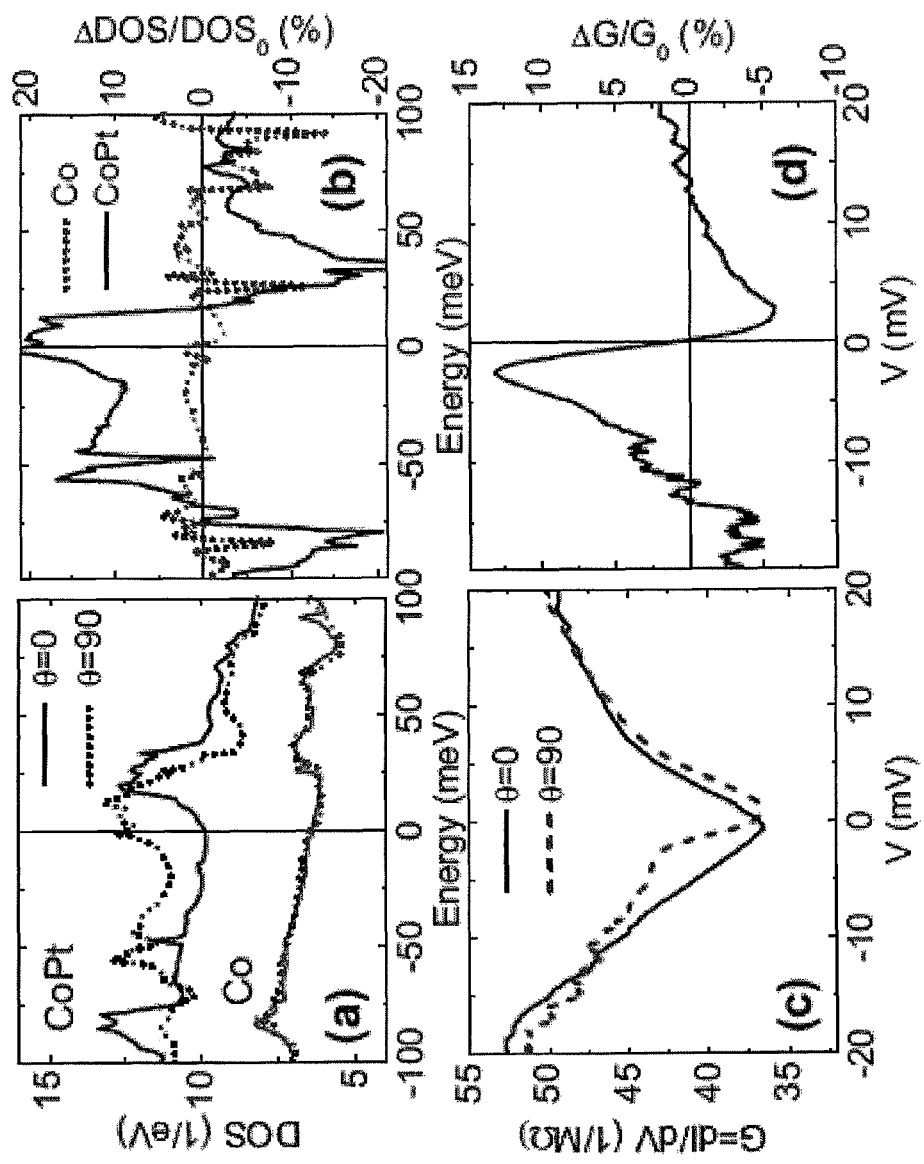
FIG. 9a illustrates theoretical density of states at θ=0° and 90° for five monolayers of Co sandwiched two-monolayer Pt films (a "Pt/Co model system") and for a thin Co layer only (a "Co model system")
FIG. 9b illustrates relative density of states anisotropy defined as (DOS(90°)−DOS(0°)/DOS(0°)) as a function of energy measured from the Fermi energy for a Pt/Co model system and a Co model system.
FIG. 9c illustrates experimental differential conductances for devices having structures corresponding to the Pt/Co model system for magnetization orientations θ=0° and 90°.
FIG. 9d illustrates relative differential conductance anisotropies as a function of bias.

In the calculations shown in FIG. 9, relaxed Co—Co and Co—Pt interlayer spacings in the stack are assumed. To estimate effects of lattice parameter variations on the TAMR, additional calculations (shown in FIG. 10a) with the Co—Co spacing in the film corresponding to bulk hexagonal close packed (hcp) Co. Qualitatively, similar shifts in the complex DOS patterns for the two magnetization orientations and comparable overall magnitude of the DOS anisotropies are obtained, but the details of the oscillatory dependence on the energy are markedly different from the calculations shown in FIG. 9.

Figure 10:
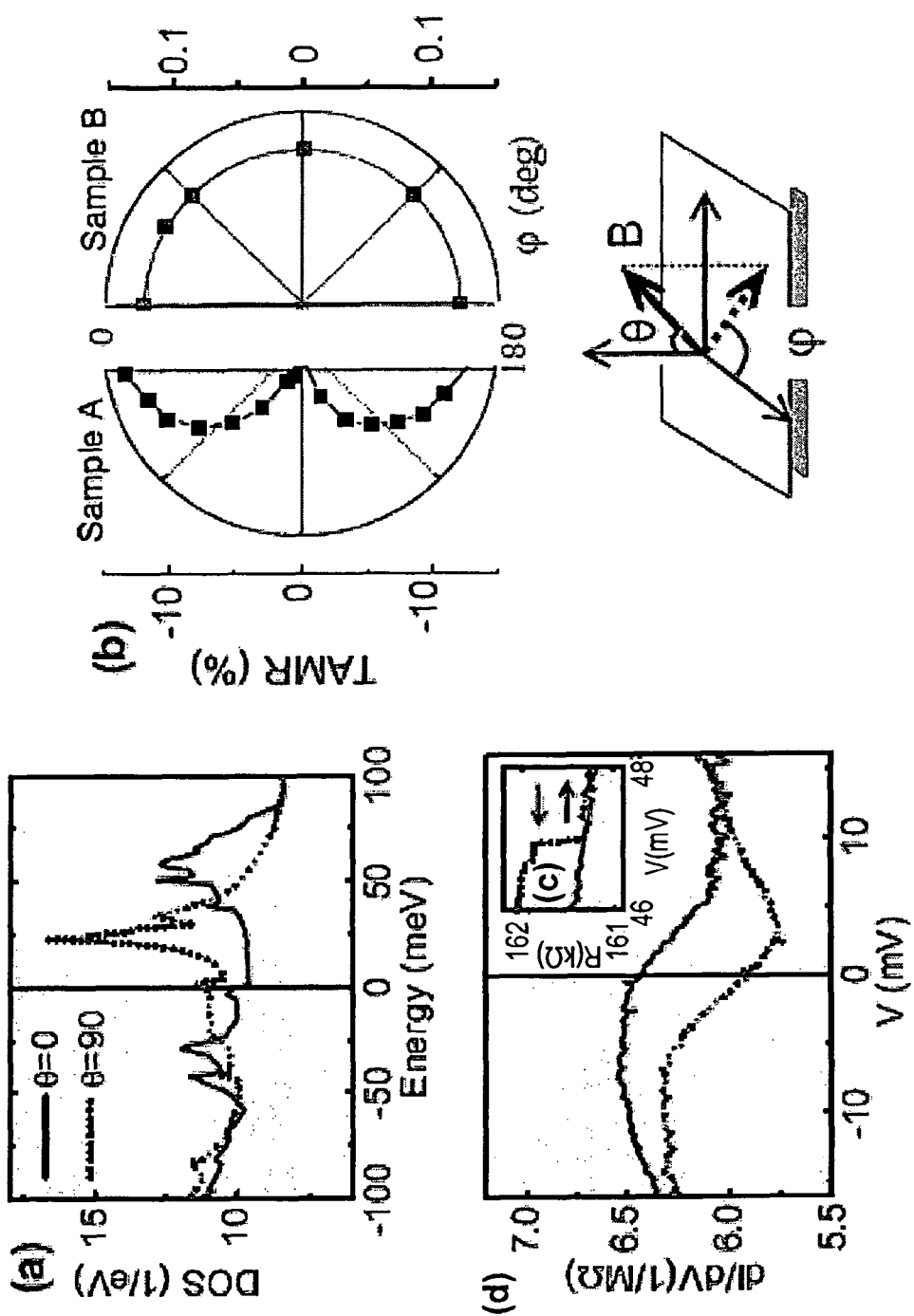
FIG. 10a illustrates theoretical density of states at θ=0° and 90° for an unrelaxed Pt/Co model system.
FIG. 10b illustrate experimental TAMR defined as (R(θ=90°, φ)−R(θ=0°)/R(θ=0°) for devices A and B.
FIG. 10c illustrates resistance measurements in two independent bias sweeps showing a discrete step in resistance.
FIG. 10d illustrates corresponding differential conductances showing a relative shift in the oscillatory bias dependence for the two measurements.

Theoretical expectation that lattice distortions can significantly alter the TAMR response seem to be reflected in complementary experiments, shown in FIG. 10b, where TAMR is studied as a function of the in-plane angle in samples of type A and B (FIGS. 6a and 6b). A uniaxial in-plane magnetocrystalline anisotropy is generated in these samples by applying in-plane magnetic field during the growth. This can be used to control magnetic anisotropies in transition metal structures and in Co/Pt systems has been ascribed to anisotropic bonding effects at the Co/Pt interface. It is therefore expected that the induced in-plane magnetic anisotropy will be reflected in the TAMR characteristics only for sample A (FIG. 6a) in which the Pt/Co interface is in contact with the tunnel barrier. Indeed, FIG. 9 shows a negligible dependence in sample B (FIG. 6b) of the TAMR on the in-plane angle φ towards which magnetization is rotated from the out-of-plane direction. In sample A (FIG. 6a), on the other hand, the dependence on φ has a uniaxial character consistent with the induced in-plane magnetocrystalline anisotropy and, notably, the magnitude of the variation with φ is comparable to the magnitude of the θ-dependent TAMR shown in FIG. 6. This result illustrates the potential for controlling the characteristics of highly sensitive TAMR devices by lattice structure engineering. The observation of the large in-plane TAMR signal in the devices confirms the SO-coupling origin of the measured tunneling anisotropy effects.

There will now be provided a brief, non-limiting discussion of the observed magnetic field and temperature dependence of the TAMR in sample A (FIG. 6a) and the implications which suggest realization of further TAMR structures with optimized sensitivity and field and thermal stability. Enhanced, compared to bulk systems, and temperature dependent susceptibility of heavy element transition metals has been studied in thin films exchange coupled to neighboring ferromagnetic layers or in dilute ferromagnetic alloys. Reference is made to Z. Celinski et al., Phys. Rev. Lett. 65, 1156 (1990) and J. Crangle and W. R. Scott, J. Appl. Phys. 36, 921 (1965). Depending on the thickness of the film or concentration of the ferromagnetic elements in the dilute alloys the systems can exhibit superparamagnetic behavior attributable to the presence of fluctuating moments in the heavy element transition metals, as explained in T. Moriya, in Spin Fluctuations in Itinerant Electron Magnetism (Springer, Berlin, Heidelberg, 1985). Experimentally, magnetization in these systems can show Curie-Weiss-like scaling with B/T, and remain unsaturated at high fields and low temperatures. It can be inferred that similar physics applies to our two-monolayer Pt film coupled to the neighboring Co layer or to intermixed Co atoms in the Pt. The observed approximate scaling of the TAMR with B/T, implicitly shown in FIG. 7, can then be partly attributed to the proportionality between TAMR and the unsaturated polarization of the Pt layer adjacent to the tunnel barrier.

Another effect which appears to contribute to the suppression of the TAMR in the type A devices (FIG. 6a) with temperature is telegraphic noise associated with randomly trapped charges presumably in the $AlO_x$ barrier or at the interface between the barrier an the Pt thin film. At low temperatures, the resulting jumps between distinct resistance states can be clearly identified, as shown in FIG. 10c, together with shifts in the corresponding oscillatory bias dependence of the differential conductance. These jumps become more frequent with increasing temperature which leads to averaging out of the TAMR signal.

The behavior demonstrates the prospect for realizing highly sensitive TAMR devices in transition metal structures.

Other transition metals, other thickness and composition of the films can be used using routine experiment so as to optimize the SO-coupling and exchange splitting of layers adjacent to the tunnel barrier. Improving the crystalline quality of the barrier and the barrier/electrode interfaces may lead enhanced magnitude and stability of the TAMR effect.

In the examples hereinbefore described, the non-ferromagnetic layer 6 comprises platinum (Pt) or other similar transition metal which interacts with the ferromagnetic layer and the device exhibits a TAMR effect.

However, as briefly mentioned earlier, in some embodiments, the non-ferromagnetic layer may be an anti-ferromagnetic layer or an anti-ferromagnetic multilayer and the device can also exhibit a TAMR effect.

Figure 11:
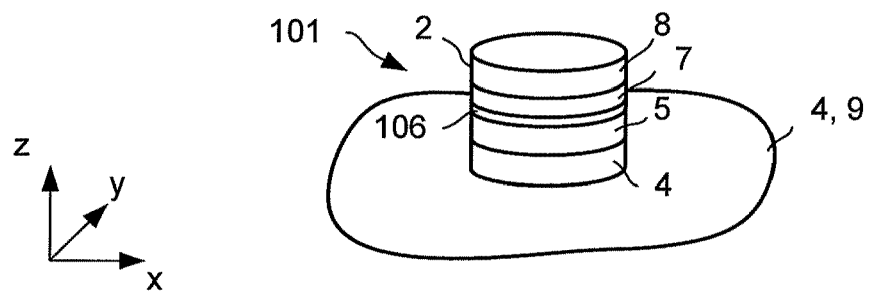
FIG. 11 is a perspective view of another magnetoresistive device in accordance with some embodiments of the present invention.
Figure 12:
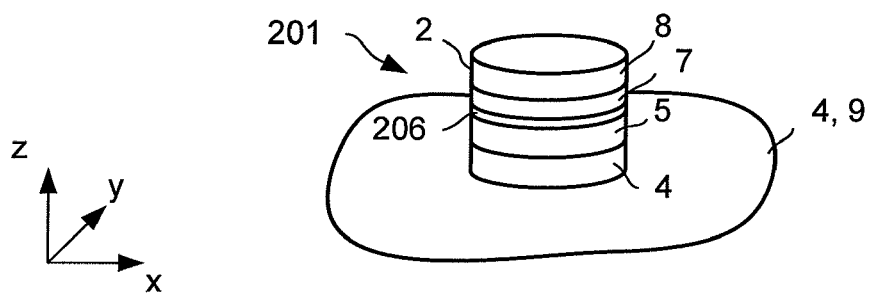
FIG. 12 is a perspective view of yet another a magnetoresistive device in accordance with some embodiments of the present invention

Referring to FIGS. 11 and 12, other magnetoresistive devices 101, 201 in accordance with some embodiments of the present invention are shown. The devices 101, 201 are the same as the device 1 (FIG. 1) described earlier except that the non-ferromagnetic layer 6 (FIG. 1) is an anti-ferromagnetic layer 106 or anti-ferromagnetic multilayer 206. The same reference numerals are used to refer to the same features described earlier.

Referring to FIG. 11, the anti-ferromagnetic layer 106 comprises an alloy of tungsten and manganese (WMn). Other antiferromagnetic alloys may be used, such as iron and manganese (FeMn), iridium and manganese (IrMn) and platinum and manganese (PtMn) and have a thickness of one monolayer. The antiferromagnetic layer 106 has a thickness of two or three monolayers. However, in some embodiments, the non-ferromagnetic layer 6 may be thicker, having a thickness of four or five monolayers or between six and ten monolayers.

Figure 12A:
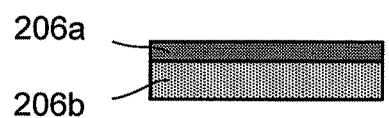
FIG. 12a illustrates a multilayer used in the device shown in FIG. 12.

Referring to FIGS. 12 and 12a, the anti-ferromagnetic multilayer 206 comprises a layer 206a of manganese (Mn) and a layer 206b of platinum (Pt). The manganese layer 206a is a monolayer thick. The platinum layer 206a may comprise one, two or three monolayers. However, in some embodiments, the manganese layer 206a may be thicker, having a thickness of four or five monolayers or between six and ten monolayers. Other materials combinations may be used, such as chromium (Cr) or manganese (Mn) on tungsten (W), or iron (Fe) or cobalt (Co) on palladium (Pd), or cobalt (Co) or iron (Fe) on iridium (Ir) or platinum (Pt), with each top layer, for example, Cr, Mn, Fe, Co, being a monolayer thick. The platinum layer 206b comprises one, two or three monolayers. However, in some embodiments, the tungsten layer 206b may be thicker, having a thickness of four or five monolayers or between six and ten monolayers.

If the anti-ferromagnetic layer 106 or anti-ferromagnetic multilayer 206 is thin, e.g. one or a few monolayers, then the exchange coupling energy with the underlying ferromagnet 5 dominates the anisotropy energy in the anti-ferromagnetic layer or multilayer so the moments in the anti-ferromagnetic layer or multilayer are coupled to the moments in the ferromagnet 5.

The anisotropy energy of the ferromagnet 5 defines the magnitude of the external magnetic field which is used for switching and which can be as low as a few mT, and the anisotropy of the density of states in the anti-ferromagnetic layer or multilayer defines the magnitude of the TAMR effect which can be larger than the TAMR effect for a non-anti-ferromagnetic, non-ferromagnetic layer, such as platinum, iridium or palladium.

The devices 101, 201 are fabricated in substantially the same way as the device 1 (FIG. 1) except that a different layer or layers of non-ferromagnetic material is or are deposited.

Figure 13:
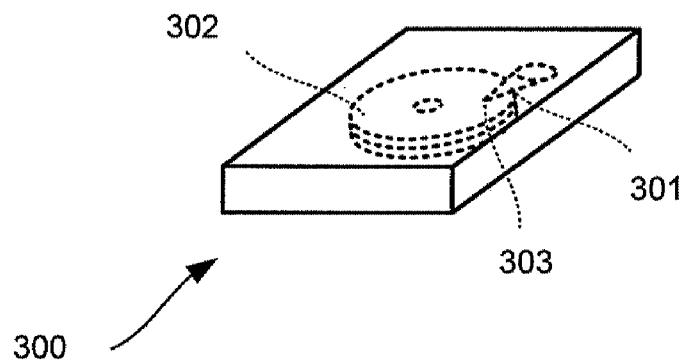
FIG. 13 is a schematic view of a hard disk drive including a magnetoresistive device in accordance with some embodiments of the present invention and FIG. 13a illustrates the magnetoresistive device shown in FIG. 13.

Referring to FIG. 13, a hard disk drive 300 including rotatable disc 301 and a slider 302 is shown.

Figure 13A:
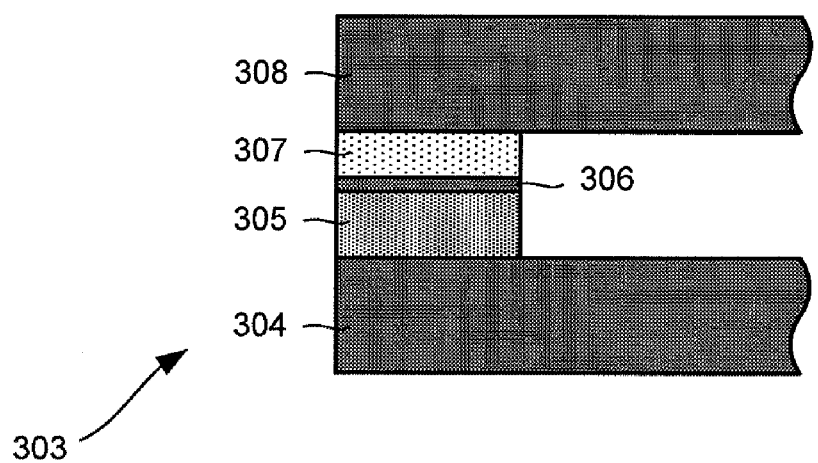

Referring also to FIG. 13a, the slider 302 supports a read head 303 arranged in a current perpendicular-to-plane (CPP) structure.

The read head 303 includes a first contact 304, a ferromagnet 305, a non-ferromagnetic region 306 separating the ferromagnet 305 from an insulating region 307 providing a tunnel barrier and a second contact region 308.

For clarity, upper and lower shields and other parts of the read head are not shown. Alternatively, contacts 304, 308 may serve as shields.

The same materials, e.g. Co/Pt/Co for the ferromagnet 305, Pt or Mn—Pt or Mn—W for the non-ferromagnetic region 306 and $AlO_x$ or MgO for the insulating layer 307, can be used and the same layer thicknesses can be used as the embodiments described earlier. The ferromagnet 305, the non-ferromagnetic region 306 and the insulating region 307 form a pillar having a diameter of the order of 10 or 100 nm and which corresponds to the track width of the disc 301.

It will be appreciated that many modifications may be made to the embodiments hereinbefore described.

For example, if a pillar structure is used, then the pillar need not be circular in plan view, but can be elliptical, regularly polygonal, such as square, or irregularly polygonal, such as rectangular.

The device need not be a vertical structure, but can be a planar structure in which layers are disposed laterally and/or overlap on a substrate.

The layer structure may be inverted such that the non-ferromagnetic region, for example a layer of transition metal and/or anti-ferromagnetic region, lies on top of the insulating layer and the ferromagnet lies on top of the non-ferromagnetic region.

If a multilayer ferromagnet is used, the multilayer may include more than two layers of ferromagnetic material. For example, the multilayer may include three layers of ferromagnetic material separated by two layers of non-ferromagnetic material such as platinum.

The invention claimed is:

1. A tunneling anisotropy magnetoresistive device comprising an insulating region arranged between a ferromagnetic region and a non-ferromagnetic conductive region so as to provide a tunnel barrier and further comprising a non-ferromagnetic region which separates the insulating region and the ferromagnetic region.

2. A device according to claim 1, wherein the non-ferromagnetic region is configured such that the ferromagnetic region induces a magnetic moment in the non-ferromagnetic region.

3. A device according to claim 1, wherein the non-ferromagnetic region comprises a metallic non-ferromagnetic material.

4. A device according to claim 3, wherein the non-ferromagnetic region comprises a transition metal or an alloy including a transition metal.

5. A device according to claim 4, wherein the transition metal or alloy comprises platinum.

6. A device according to claim 4, wherein the transition metal or alloy comprises palladium.

7. A device according to claim 4, wherein the transition metal or alloy comprises iridium.

8. A device according to claim 1, wherein the non-ferromagnetic region is antiferromagnetic.

9. A device according to claim 8, wherein the non-ferromagnetic region comprises a single layer.

10. A device according to claim 8, wherein the non-ferromagnetic region comprises an antiferromagnetic material.

11. A device according to claim 8, wherein the antiferromagnetic material comprises a rare earth element or an alloy including a rare earth element.

12. A device according to claim 11, wherein the antiferromagnetic material includes antiferromagnetic dysprosium.

13. A device according to claim 11, wherein the antiferromagnetic material includes antiferromagnetic erbium.

14. A device according to claim 11, wherein the antiferromagnetic material includes gadolinium and europium, preferably GdEuS.

15. A device according to claim 8, wherein the antiferromagnetic material comprises a transition metal or an alloy including a transition metal.

16. A device according to claim 15, wherein the antiferromagnetic material includes platinum.

17. A device according to claim 15, wherein the antiferromagnetic material includes manganese.

18. A device according to claim 8, wherein the antiferromagnetic material comprises an antiferromagnetic oxide.

19. A device according to claim 18, wherein the antiferromagnetic material includes α-iron(III)oxide ($Fe_2O_3$).

20. A device according to claim 9, wherein the layer has a thickness of one, two or three monolayers.

21. A device according to claim 9, wherein the layer has a thickness of more than three monolayers.

22. A device according to claim 8, wherein the non-ferromagnetic region comprises at least two layers.

23. A device according to claim 22, wherein the non-ferromagnetic region comprises first and second layers.

24. A device according to claim 23, wherein the first layer comprises a first transition metal or an alloy including the first transition metal and the second layer comprises second, different transition metal or an alloy including the second transition metal.

25. A device according to claims 24, wherein the first layer comprises chromium.

26. A device according to claim 23, wherein the first layer comprises a ferromagnetic material and is configured such that the material behaves antiferromagnetically.

27. A device according to claim 26, wherein the first layer comprises manganese, iron and/or cobalt.

28. A device according to claim 23, wherein the second layer comprises tungsten, palladium, platinum and/or iridium.

29. A device according to claim 23, wherein the first layer has a thickness of one, two or three monolayers.

30. A device according to claim 23, wherein the second layer has a thickness of one, two or three monolayers.

31. A device according to claim 1, wherein the non-ferromagnetic region is ferromagnetic.

32. A device according to claim 1, wherein the ferromagnetic region comprises a metallic ferromagnetic material.

33. A device according to claim 32, wherein the metallic ferromagnetic material comprises cobalt, nickel or iron or an alloy comprising cobalt, nickel and/or iron.

34. A device according to claim 1, wherein the ferromagnetic region comprises at least two ferromagnetic regions separated by a non-ferromagnetic region.

35. A device according to claim 34, wherein the non-ferromagnetic region comprises a metallic non-ferromagnetic material.

36. A device according to claim 35, wherein the metallic non-ferromagnetic material comprises platinum.

37. A device according to claim 1, wherein the insulating region comprises an oxide.

38. A device according to claim 37, wherein the insulating region comprises aluminum oxide.

39. A device according to claim 37, wherein the insulating region comprises magnesium oxide.

40. A device according to claim 1, wherein the insulating region has a thickness separating the conductive region and the non-ferromagnetic region of at least about 2 nm.

41. A device according to claim 40, wherein the thickness of the insulating region is no more than about 10 nm.

42. A device according to claim 1, wherein the conductive region comprises a transition metal or an alloy including a transition metal.

43. A device according to claim 42, wherein the conductive region comprises platinum.

44. A device according to claim 1, arranged as a multilayer stack including the ferromagnetic region, the non-ferromagnetic region, the insulating region and the conductive region.

45. A device according to claim 1, arranged as a pillar upstanding from a substrate.

46. A device according to claim 45, wherein the pillar has a width no more than about 10 μm or width no more than about 1 μm.

47. A device according to claim 45, wherein the pillar has a width of the order of 10 nm or 100 nm.

48. A device according to claim 1, wherein the conductive region includes a resonant tunneling structure for filtering charge carriers.

49. A magnetic field sensor comprising a device according to claim 1.

50. A read head for a hard disk drive comprising a device according to claim 1.

51. A switching element comprising a device according to claim 1.

52. A device according to claim 1, wherein the insulating region does not comprise magnesium oxide.

* * * * *